US012798036B2

(12) United States Patent
Tseng et al.

(10) Patent No.: US 12,798,036 B2
(45) Date of Patent: Nov. 17, 2026

(54) METHOD AND SYSTEM FOR SLURRY QUALITY MONITORING

(71) Applicant: TAIWAN SEMICONDUCTOR MANUFACTURING COMPANY LTD., Hsinchu (TW)

(72) Inventors: Chih-Chiang Tseng, Hsinchu County (TW); Chwen Yu, Taipei City (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 864 days.

(21) Appl. No.: 17/409,407

(22) Filed: Aug. 23, 2021

(65) Prior Publication Data

US 2022/0362902 A1 Nov. 17, 2022

Related U.S. Application Data

(60) Provisional application No. 63/189,058, filed on May 14, 2021.

(51) Int. Cl.
*B24B 37/005* (2012.01)
*B24B 37/04* (2012.01)
(Continued)

(52) U.S. Cl.
CPC .......... *B24B 37/005* (2013.01); *B24B 37/044* (2013.01); *B24B 57/02* (2013.01);
(Continued)

(58) Field of Classification Search
CPC ..... B24B 37/005; B24B 37/042; B24B 37/04; B24B 37/044; B24B 57/02; B24B 37/34;
(Continued)

(56) References Cited

U.S. PATENT DOCUMENTS 5,417,107 A * 5/1995 Biencourt .......... G01N 33/2823 324/689
6,338,671 B1 * 1/2002 Kawashima ............ B24B 57/02 451/87
(Continued)

FOREIGN PATENT DOCUMENTS

CN 1356369 A 7/2002
EP 2228648 A3 5/2013
(Continued)

OTHER PUBLICATIONS

English Abstract of CN1356369A.
(Continued)

*Primary Examiner* — Monica S Carter
*Assistant Examiner* — Kent N Shum
(74) *Attorney, Agent, or Firm* — WPAT LAW; Anthony King

(57) ABSTRACT

A method includes: delivering a slurry to a semiconductor tool through a piping network of a slurry delivery system; coupling an electrode pair to an outer wall of a pipe of the piping network; measuring one or more capacitance values associated with the electrode pair with the slurry being an insulting layer between the electrode pair; and deriving a quality metric of the slurry according to the one or more capacitance values.

20 Claims, 8 Drawing Sheets

(51) Int. Cl.

| | |
|---|---|
| ***B24B 57/02*** | (2006.01) |
| ***G01F 1/76*** | (2006.01) |
| ***G01N 27/22*** | (2006.01) |
| ***H10P 52/40*** | (2026.01) |
| ***H10P 74/00*** | (2026.01) |

(52) U.S. Cl.
CPC ............. *G01F 1/76* (2013.01); *G01N 27/221* (2013.01); *H10P 52/402* (2026.01); *H10P 74/23* (2026.01)

(58) Field of Classification Search
CPC ......... B24B 57/04; G01F 1/76; G01N 27/221; G01N 27/22; G01N 27/226; G01N 33/00; G01R 27/26; H01L 21/30625; H01L 21/306; H01L 22/20; H01L 21/67; H01L 21/67017; G05D 11/02; G05D 7/06; G05D 11/13; F17D 1/08; F17D 1/00; B65D 90/00; F16L 9/19
See application file for complete search history.

(56) References Cited

U.S. PATENT DOCUMENTS

| | | | | |
|---|---|---|---|---|
| 2001/0024878 | A1 | 9/2001 | Nakamura | |
| 2002/0061722 | A1* | 5/2002 | Kondo | B24B 37/04 451/60 |
| 2002/0158637 | A1* | 10/2002 | Warmack | G01R 35/005 324/601 |
| 2003/0122555 | A1* | 7/2003 | Baron | G01N 27/221 324/668 |
| 2003/0184316 | A1* | 10/2003 | Yamagishi | G01N 27/228 324/663 |
| 2004/0194336 | A1 | 10/2004 | Xu et al. | |
| 2005/0070214 | A1 | 3/2005 | Marquardt et al. | |
| 2007/0295063 | A1* | 12/2007 | Cho | G01N 1/38 29/25.01 |
| 2011/0177623 | A1* | 7/2011 | Benner | B24B 57/02 451/5 |
| 2012/0182030 | A1 | 7/2012 | Calciolari et al. | |
| 2014/0261824 | A1 | 9/2014 | Byers et al. | |
| 2017/0152402 | A1* | 6/2017 | Huang | C09G 1/02 |
| 2019/0383762 | A1* | 12/2019 | Stephanou | G01R 27/2605 |

FOREIGN PATENT DOCUMENTS

| | | | |
|---|---|---|---|
| EP | 3564771 | A2 | 11/2019 |
| TW | I237113 | B | 8/2005 |
| TW | I574789 | B | 3/2017 |
| TW | 201838768 | A | 11/2018 |
| TW | I693395 | B | 5/2020 |

OTHER PUBLICATIONS

T.S. Light et al., "The Conductivity of Low Concentrations of CO2 Dissolved in Ultrapure Water From 0-100° C," 209th American Chemical Society National Meeting, Anaheim, CA, Apr. 2-6, 1995.
A. Angulo-Sherman and H. Mercado-Uribe, "Dielectric spectroscopy of water at low frequencies: The existence of an sopermitive point," Chemical Physics Letters, 503 (2011) pp. 327-330, 2011.
Kai Liu, "Development of Capacitance Sensor for Oil Online Monitoring and Research of Online Test Method", Chinese Master's Theses Full-text Database Information Science and Technology, Issue 3, 2009, pp. 13-60. The relevant portions of this reference have been identified, translated into English, and appended to this reference.
WO1999065592A1 is the counterpart application of CN1305393A and is appended to the CN1305393A, serving as its English translation.
An English language translation of reference CN 1305393A submitted in previous IDS.

* cited by examiner

Replacement Sheet

METHOD AND SYSTEM FOR SLURRY QUALITY MONITORING

PRIORITY CLAIM AND CROSS-REFERENCE

This application claims priority to U.S. Provisional Application No. 63/189,058 filed May 14, 2021, the disclosure of which is hereby incorporated by reference in its entirety.

BACKGROUND

The manufacturing of the semiconductor devices with an increased device density is becoming increasingly complicated. Among the various semiconductor processing steps, planarization or polishing schemes, e.g., chemical mechanical polish (CMP) has been widely used for thinning or polishing a processed surface of the semiconductor device. The polishing is performed with the help of slurry to facilitate the polishing efficiency and performance. The performance of the polishing operation is therefore closely related to the quality of the slurry.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1:
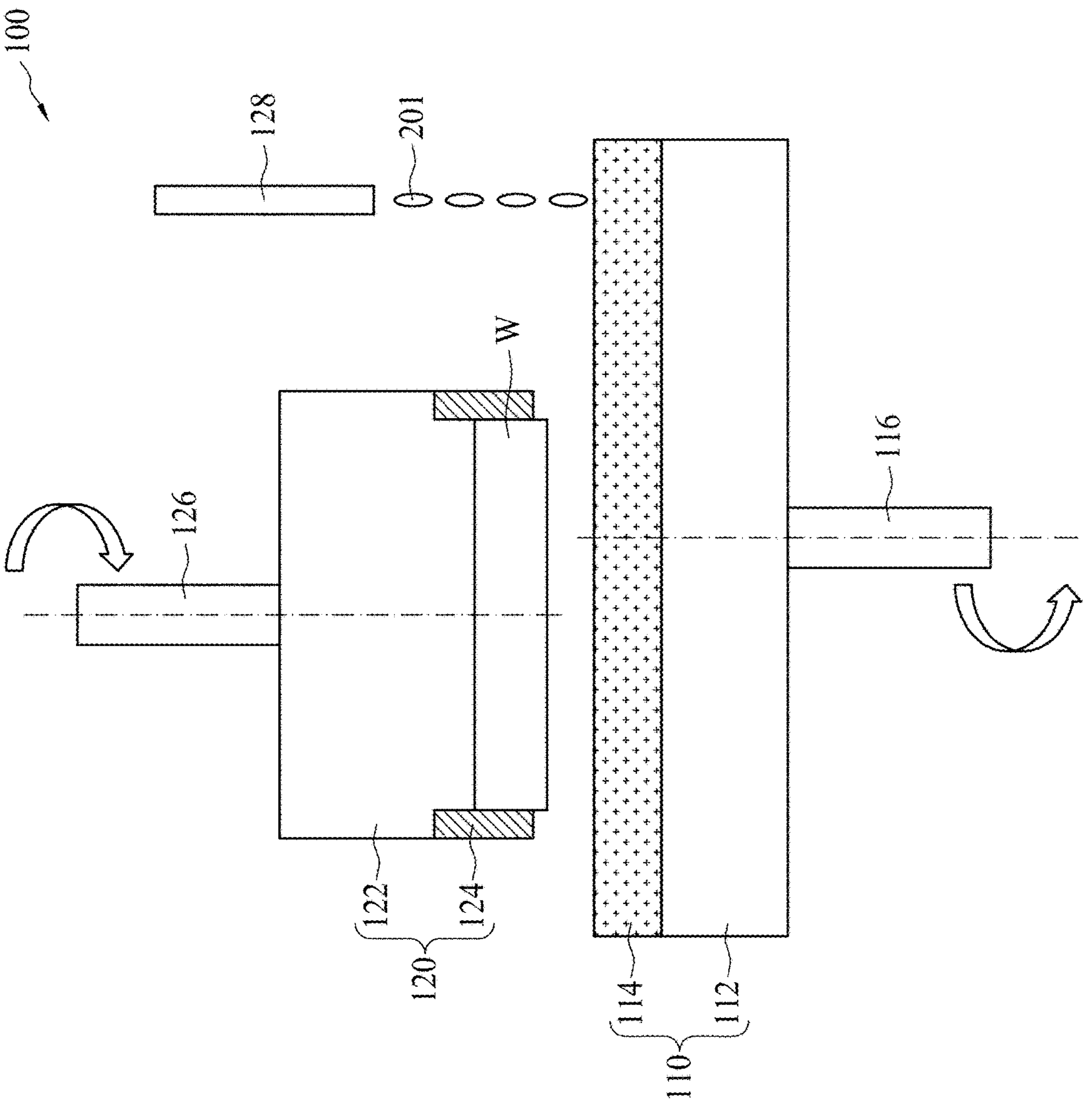
FIG. 1 is a schematic block diagram of a chemical mechanical polish (CMP) apparatus according to some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the deviation normally found in the respective testing measurements. Also, as used herein, the terms "about," "substantial" or "substantially" generally mean within 10%, 5%, 1% or 0.5% of a given value or range. Alternatively, the terms "about," "substantial" or "substantially" mean within an acceptable standard error of the mean when considered by one of ordinary skill in the art. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the terms "about," "substantial" or "substantially." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as being from one endpoint to another endpoint or between two endpoints. All ranges disclosed herein are inclusive of the endpoints, unless specified otherwise.

The terms "couple," "coupled" and "coupling" used throughout the present disclosure describe the direct or indirect connections between two or more devices or elements. In some cases, a coupling between at least two devices or elements refers to mere electrical or conductive connections between them and intervening features may be present between the coupled devices and elements. In some other cases, a coupling between at least two devices or elements may involve physical contact and/or electrical connections.

The present disclosure relates generally to a system and a method of monitoring the quality of a CMP slurry. The CMP slurry plays an important role in a CMP operation. However, a reliable and universal monitoring metric of the slurry quality is not available to determine whether the slurry quality changes across different batches or within the same batch of the shipped slurry. As such, through the proposed monitoring scheme, the slurry quality can be accessed by the semiconductor manufacturer in the absence of the proprietary information of the compositions and their respective percentages in the slurry. The slurry quality monitoring can thus be conducted against each batch prior to the dispensing of the slurry to the CMP tool. The performance of the CMP operation can be enhanced, and production yield can be improved accordingly.

FIG. 1 is a schematic block diagram of a chemical mechanical polish (CMP) apparatus 100 according to some embodiments of the present disclosure. As depicted in FIG. 1, the CMP apparatus 100 includes a polishing wheel assembly 110 and a wafer carrier assembly 120. The polishing wheel assembly 110 includes a polishing platen 112 and a polishing pad 114. The polishing platen 112 is coupled to a spindle (or a shaft) 116. In some embodiments, the spindle 116 is rotated by any suitable motor or driving mechanism. The polishing pad 114 is attached on the polishing platen 112, and thus is able to be rotated along with the polishing platen 112. The wafer carrier assembly 120 includes a wafer carrier 122 configured to hold or to grip a wafer W. The wafer carrier 122 is coupled to another spindle (or a shaft) 126. In some embodiments, the spindle 126 is rotated by a suitable motor or driving mechanism. The rotation of the wafer carrier 122 and the rotation of the polishing platen 112 may be independently controlled. The rotational direction of the wafer carrier 122 or the rotational direction of the polishing platen 112 can be clockwise or counterclockwise. In some embodiments, the wafer carrier 122 further includes a retainer ring 124 for retaining the wafer W to be polished. The retainer ring 124 is configured to prevent the wafer W from sliding out from under the wafer carrier 122 as the wafer carrier 122 moves. In some embodiments, the retainer ring 124 has a ring-shaped structure.

During a CMP operation, the polishing pad 114 coupled to the polishing platen 112 and the wafer W retained by the retainer ring 124 are both rotated at appropriate rates. Meanwhile, the spindle 126 is configured to support a downward force, which is exerted against the wafer carrier 122, and thus is exerted against the wafer W, thereby causing the wafer W to be in contact with the polishing pad 114. Thus, the wafer W or an overlying film (not shown) over the wafer W is polished. During the CMP operation, a slurry introduction device 128 introduces a slurry 201 on the polishing pad 114. The composition of slurry 201 may be selected depending on the material of the wafer W or the overlying film to be polished. For example, the types of the slurry 201 may be roughly classified into a slurry for oxide, a slurry for metal, and a slurry for polysilicon according to the type of object to be polished.

The composition of the slurry 201 may include a liquid carrier, e.g., deionized wafer, with solid abrasives to provide mechanical polishing force. The composition of the slurry 201 may further include chemicals such as oxidizer to react with the material to be polished for facilitating the removal of the material to be polished. In some embodiments, the slurry 201 includes a pH adjustment agent configured to adjust the pH value of the slurry 201. In some embodiments, the slurry 201 includes one or more corrosion inhibitor configured to prevent undesired corrosion or etching during the CMP operation. In some embodiments, the slurry 201 includes mixtures of chemicals in a weight percentage between about 0.01% and 5% or between about 0.1% and about 4%, such as about 1%.

The quality or performance of the slurry 201 may be characterized by one or more properties. For example, the performance of the slurry 201 is accessed according to an average removal rate with respect to a material to be polished. In other examples, the performance of the slurry 201 is accessed according to the variations of the removal rate with respect to a material to be polished. In some embodiments, the slurry 201 is regarded as disqualified or does not meet the specification when the removal rate associated with the slurry 201 does not comply the requirements of the average removal rate or the removal rate variation. In some embodiments, the performance of the slurry 201 is determined by the compositions and their percentages in the slurry 201 in addition to the abrasives, even though the percentages of these compositions are relatively small. Therefore, to ensure that the CMP operation is performed with desirable performance, the quality of the slurry 201 should be kept within at an acceptable and stable range.

In some embodiments, the slurry specification includes at least one of a predetermined highest removal rate, a predetermined lowest removal rate, and a predetermined removal rate variation threshold with respect to a target slurry. In some embodiments, a target slurry is regarded as meeting the specification if the removal rate(s) associated with the target slurry is between the highest removal rate and the lowest removal rate. In some embodiments, a target slurry is regarded as meeting the specification if the variation of the removal rates associated with the target slurry is lower than the removal rate variation threshold. The slurry specifications may be different for different types of slurries since the compositions and percentages are different for different types of slurries.

In some embodiments, the predetermined highest removal rate is in a range between about 500 angstrom per minute and about 5000 angstrom per minute. In some embodiments, the predetermined lowest removal rate is in a range between about 50 angstrom per minute and about 3000 angstrom per minute. In some embodiments, the predetermined removal rate variation threshold is in a range between about 20 angstrom per minute and about 1000 angstrom per minute.

Figure 2:
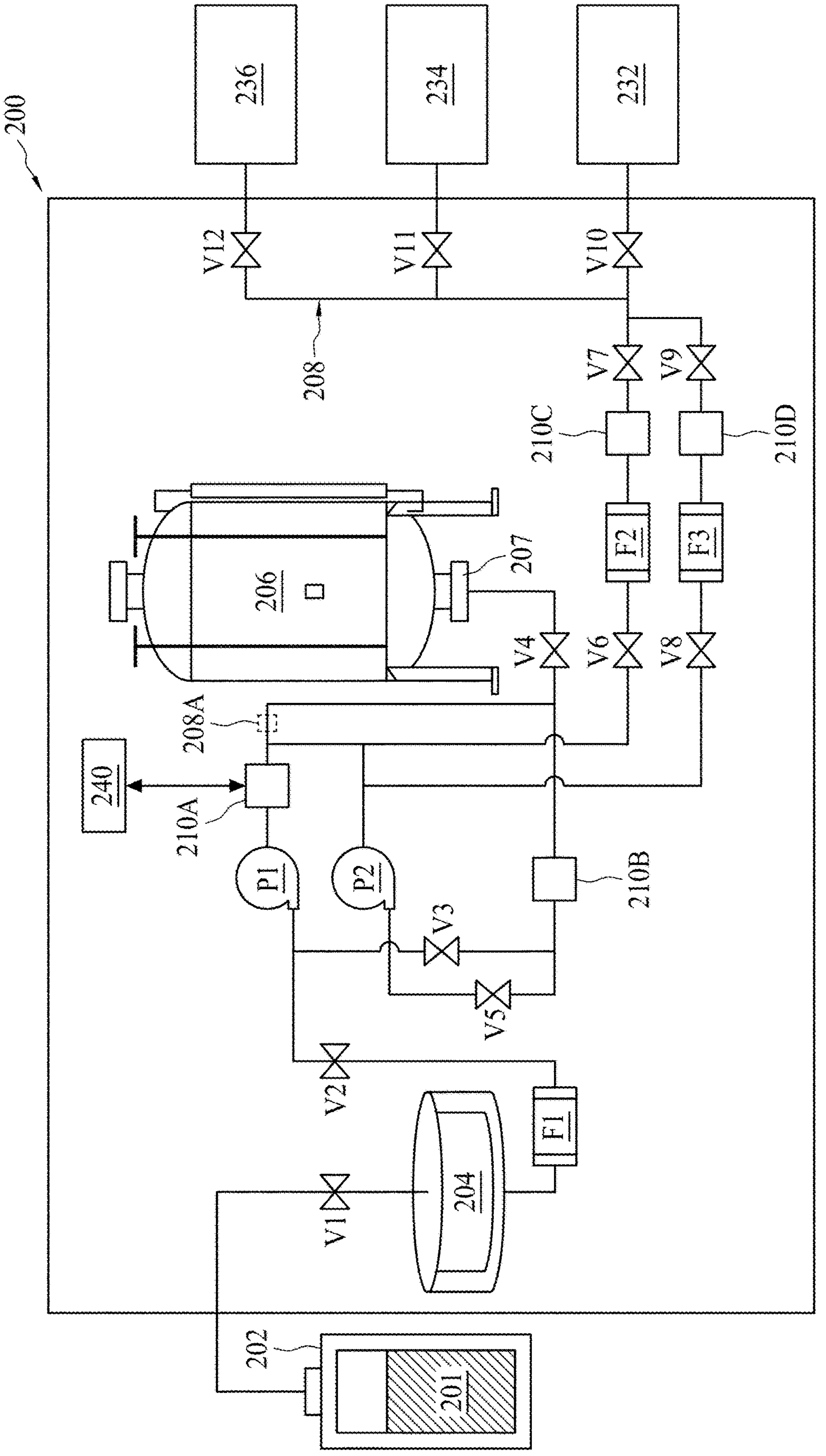
FIG. 2 is a schematic block diagram of a slurry delivery system, in accordance with some embodiments of the present disclosure.

FIG. 2 is a schematic block diagram of a slurry delivery system 200, in accordance with some embodiments of the present disclosure. The slurry delivery system 200 is configured to receive slurry 201 in a supply container 202 by a third-party slurry provider or vendor (not shown). In some embodiments, the supply container 202 is a portable container used to contain the slurry 201. The slurry 201 provided in the supply container 202 may be referred to as raw slurry 201. The supply container 202 with the raw slurry 201 may be shipped to a foundry of a semiconductor manufacturer where the slurry delivery system 200 is deployed. The slurry is then fed from the supply container 202 to one or more semiconductor tools 232, 234 and 236. The semiconductor tools 232, 234 and 236 may be a CMP tool, e.g., a CMP apparatus 100 shown in FIG. 1.

The slurry delivery system 200 includes a dilution tank 204, a storage tank 206, a piping network 208, pumps P1 and P2, filters F1, F2 and F3, valves V1, V2, V3, . . . V12, and one or more quality sensors 210. In some embodiments, the dilution tank 204 includes an inlet and an outlet, wherein the inlet is configured to receive raw slurry 201 from the supply container 202 provided or shipped by the slurry vendor. The outlet is configured to transport slurry 201 after blending or dilution into the piping network. The dilution tank 204 may include another inlet (not separately shown) configured to receive a dilution solution, such as deionized water, for diluting the raw slurry 201 into the blended slurry 201 before delivering the slurry 201 is sent for the CMP operation. In some embodiments, the dilution tank 204 further includes a blending blade (not separately shown) configured to blending the raw slurry 201 with the dilution solution. In some embodiments, the dilution tank 204 is omitted, and the raw slurry 201 is directly sent to the piping network 208.

In some embodiments, the storage tank 206 is configured to store the slurry 201 after dilution and transport the slurry 201 through the piping network 208. In some embodiments, the storage tank 206 includes an access port 207 configured as an inlet and an outlet of the storage tank 206. The slurry 201 is transported from the dilution tank 204 to the storage tank 206 through a first part of the piping network 208. The slurry 201 is further provided to the semiconductor tool 232, 234 or 236 through a second part of the piping network 208.

In some embodiments, pipes are used for constructing the piping network 208, through which the slurry 201 are delivered. The pipes may have an outside diameter of between about ⅛ inches and about one inch. The pipes may be formed physically and chemically stable materials, such as perfluoroalkoxy alkanes (PFA) to reduce the likelihood of chemical reaction of the pipes with the slurry 201, in some other embodiments, stainless steel (SS) or polyethylene (PE) may be used in the pipes of the piping network 208. In some embodiments, the piping network 208 includes a first portion connecting the dilution tank 204 to the storage tank 206, and a second portion connecting the storage tank 206 to the semiconductor tool 232, 234 or 236. The first portion is connected to the second portion through the storage tank 206.

In some embodiments, valves V1 through V12 are configured to control the flow direction of the slurry 201 in the piping network 208. In some embodiments, each of the valves V1 through V12 includes a check valve configured to prevent the slurry 201 from flowing in a reverse direction. In some embodiments, the valves V1 through V12 are switched on or off on demand and configured to isolate a portion of the slurry 201 from other portions of the slurry 201 and keep such portion from flowing temporarily in the piping network 208. In some embodiments, one or more of the valves V1 through V12 are switched off to cause a sampled slurry portion in the piping network 208 to be immobile during a period of sensing time in a quality sensing operation. For example, the valves V6 and V7 may be switched off to facilitate the quality sensing operation on the sampled slurry portion between the valves V6 and V7 by the quality sensor 210C.

Pumps P1 and P2 are arranged in the piping network 208 to pump the slurry 201 from the dilution tank 204, through the storage tank 206 and toward the semiconductor tool 232, 234 and 236. The pumps P1 and P2 are configured to pump the slurry 201 to flow in the piping network 208 through proper switching of valves V2 through V12. In some embodiments, the pump P1 or P2 may be a centrifugal pump, a diaphragm pump and a peristaltic pump.

In some embodiments, the pump P1 is arranged between the dilution tank 204 and the storage tank 206, and configured to pump the slurry 201 from the dilution tank 204 to the storage tank 206 through opening the valves V2 and V4. In such cases, the valve V3 or V6 may be closed. Similarly, in some embodiments, the pump P1 is configured to pump the slurry 201 from the dilution tank 204 to the semiconductor tool 232, 234 or 236 through opening the valves V2, V6 and V7 and the individual valves V10, V11 or V12 for the semiconductor tool 232, 234 or 236. In such cases, the valve V4 may be closed. In some embodiments, the pump P2 is arranged between the storage tank 206 and the semiconductor tool 232, 234 or 236, and configured to pump the slurry 201 from the storage tank 206 to the semiconductor tool 232, 234 or 236 through opening the valves V4, V5, V6, V7 and the individual valve V10, V11 or V12 for the semiconductor tool 232, 234 or 236. In the meantime, the valves V3 and V8 may be closed. In some embodiments, the pump P2 is arranged between the storage tank 206 and the semiconductor tool 232, 234 or 236, and configured to pump the slurry 201 from the storage tank 206 to the semiconductor tool 232, 234 or 236 through opening the valves V4, V5, V8, V9 and the individual valve V10, V11 or V12 for the semiconductor tool 232, 234 or 236. In the meantime, valves V3 and V6 may be closed.

Filters are arranged in the piping network 208 and configured to filter contaminants. In some embodiments, the filters are configured to remove particles that are too large in size, i.e., a size out of specification. In some embodiments, the filters include membrane having porous materials of specified pore sizes that are used to block particles of sizes greater than the pores. The number of the filters used in the slurry delivery system 200 may be determined based on system requirements and there might be more than one filters deployed in appropriate locations on the piping network 208 to maintain quality of the slurry 201. For example, a filter F1 is arranged downstream of the dilution tank 204, and configured to filter the slurry 201 at the output of the dilution tank 204. The filter F2 is arranged downstream of the pump P1 and the valve V6, and configured to filter the slurry 201 at the output of the pump P1. Similarly, a filter F3 is arranged downstream of the pump P2 and the valve V8, and configured to filter the slurry 201 at the output of the pump P1.

The quality sensors 210 are configured to monitor quality of the slurry 201. The performance of the slurry 201 in a CMP operation is closely related to its physical, chemical or electrical properties. A slight deviation of the physical, chemical and electrical properties of the compositions of the slurry 201 may cause the polishing performance of the CMP to fall below the polishing specification or to fluctuate between different slurry batches of the supply container 202. In addition, as semiconductor manufacturing technology evolves, the feature size continues to reduce, and thus the tolerance of the CMP operation becomes more stringent since an identical polishing deviation of the CMP operation in an advanced technology node would lead to more pronounced effects than that in a mature technology node. As such, the quality sensors 210 are introduced to perform real-time and universal monitoring of the slurry 201 in order to detect abnormal conditions of the slurry 201 within the slurry delivery system 200.

In some embodiments, the quality sensors 210 include at least one of a liquid particle counter, a particle size distribution analyzer, a pH sensor, a hydrogen peroxide sensor, a density sensor, a conductivity sensor, an ion concentration sensor, or the like. In some embodiments, the quality sensor 210 further include a feed module, a blend module or a distribution module to facilitate the sensing operation of the quality sensor 210. In some embodiments, the quality sensors 210 include one or more capacitance sensors for monitoring the capacitance values associated with the slurry 201.

In some embodiments, the slurry delivery system 200 further includes a processor 240 coupled to the quality sensors 210 for controlling quality sensing operations of the quality sensors 210 and receiving sensor data acquired by the quality sensors 210. In some embodiments, the processor 240 is configured to transmit a control or sensing signal to switch on the quality sensors 210 for performing a sensing operation. In some embodiments, the processor 240 is configured to process or analyze the data provided by the quality sensors 210, e.g., the quality sensor 210A as illustrated in FIG. 2, and determine whether quality of the slurry 201 is within the specification.

In some embodiments, an instance of the quality sensor 210, referred to as 210A, is arranged in a pipe section of the piping network 208 between the pump P1 and the storage tank 206 for monitoring slurry quality between the pump P1 and the storage tank 206. In some embodiments, an instance of the quality sensor 210, referred to as 210B, is arranged in a pipe section of the piping network 208 between the storage tank 206 and the pump P2 for monitoring slurry quality between the storage tank 206 and the pump P2. In some embodiments, an instance of the quality sensor 210, referred to as 210C, is arranged in a section of the piping network 208 between the pump P2 and the semiconductor tool 232, 234 or 236, e.g., in a location downstream of the filter F2, for monitoring slurry quality between the pump P2 and the semiconductor tool 232, 234 or 236. In some embodiments, an instance of the quality sensor 210, referred to as 210D, is arranged in a pipe section of the piping network 208 between the pump P2 and the semiconductor tool 232, 234 or 236, e.g., in a location downstream of the filter F3, for monitoring slurry quality between the pump P2 and the semiconductor tool 232, 234 or 236.

As discussed previously, the quality metrics of the slurry may include a physical metric, a chemical metric, an electrical metric, a combination thereof, or the like. In some embodiments, the quality metrics include a pH value of the slurry 201. In some embodiments, the quality metrics include a liquid particle size of the slurry 201. In some embodiments, the quality metrics include a concentration of hydrogen peroxide in the slurry 201. In some embodiments, the quality metrics include a density of the slurry 201. In some embodiments, the quality metrics include a conductivity of the slurry 201. In some embodiments, the quality metrics include an ion concentration of one or more compositions of the slurry 201.

In some embodiments, although some of the quality metrics of monitoring the slurry 201 have been developed, these quality metrics may not be adequate in serving as real-time indicators of the slurry 201. One reason why these quality metrics may not be adequate is due to the fact that the compositions and their percentages are usually unavailable when the slurry 201 is delivered. The semiconductor manufacturer may not obtain information on the crucial compositions of the slurry 201. Another reason is that in some scenarios the adopted quality metrics may not be sensitive enough with respect to the removal rate performance of the slurry 201. For example, a widely used chemical analytical method called high-performance liquid chromatography (HPLC) is employed to ascertain the compositions and percentages of the slurry 201; however, the blind analytical result of the slurry 201 in the absence of information on the compositions of the slurry 201 may make it difficult to sense the mild quality change of the slurry 201.

As such, in the present disclosure, the dielectric permittivity, or simply called permittivity, of the slurry 201 delivered through the pipes of the piping network 208 is proposed to serve as a composite quality metric of the slurry 201. The permittivity, or equivalently, the dielectric constant, which is defined as a ratio between the permittivity of the slurry 201 to the permittivity of air, describes the capability of the slurry 201 to hold electrical charges. In the depicted embodiment, the permittivity of the slurry 201 is adopted as an effective quality monitoring metric because it is more sensitive to slurry quality than other quality metrics previously discussed, and thus is more suitable for monitoring the slurry quality in real time. In addition, the monitoring of the permittivity of the slurry 201 does not require a priori information of the composition of the slurry 201, which feature is more advantageous for the semiconductor manufacturer when such composition information is kept as business secrets by the slurry vendors. Moreover, the permittivity of the slurry 201 not only is detectable but also can be assessed quantitatively.

Figure 3B:
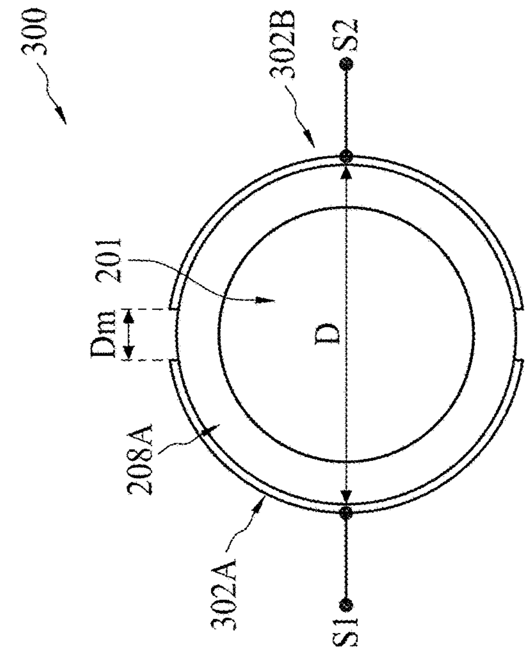
FIGS. 3A and 3B show a perspective view and a cross-sectional view, respectively, of a capacitor structure, in accordance with various embodiments of the present disclosure.
Figure 3A:
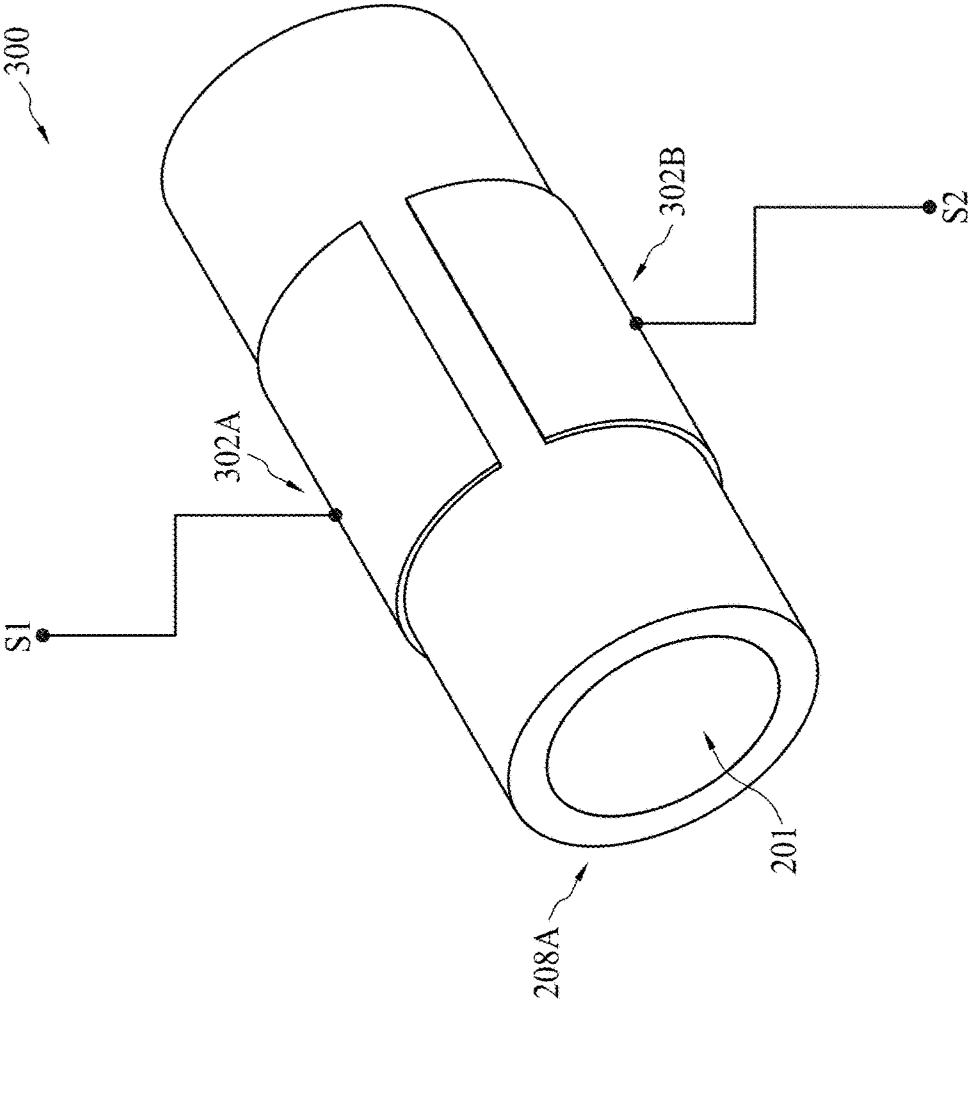

In some embodiments, the permittivity of the slurry 201 is derived through measurements of the capacitance values of a capacitor structure 300 as the quality sensor 210. FIGS. 3A and 3B show a perspective view and a cross-sectional view, respectively, of the capacitor structure 300, in accordance with various embodiments of the present disclosure. The capacitor structure 300 includes an electrode pair 302A and 302B arranged on the outer sidewall of an exemplary pipe or pipe section 208A of the piping network 208. In some embodiments, the electrode 302A and the electrode 302B are arranged opposite to each other with the pipe section 208A arranged therebetween. In the present embodiment, the piping network 208, or at least the pipe section 208A of the piping network 208, is formed of PFA. Therefore, the pipe section 208A serves as the insulating layer of a capacitor separating the electrode pair 302A and 302B. In other words, the capacitor of the capacitor structure 300 is formed by the electrode pair 302A, 302B and the insulating layer formed by the pipe section 208A.

In some embodiments, the electrode 302A or 302B has a curved plate shape conformal to the outer wall of the pipe section 208A. Therefore, as shown in FIG. 3B, the electrode 302A or 302B has a uniform thickness along the circumference of the outer wall of the pipe section 208A. In some other embodiments, the electrode 302A or 302B wraps around the pipe section 208A and has non-uniform thicknesses around the pipe section 208A. For example, the electrode 302A or 302B has an arched shape or a crescent shape from a cross-sectional view. The electrode 302A or 302B may have an electrode area A. In some embodiments, the electrodes 302A and 302B have substantially equal areas. An effective distance Deff between the electrode 302A and the electrode 302B may be defined as a distance D between the electrode 302A and the electrode 302B measured at their central points, i.e., a diameter D of the pipe section 208A. In some other embodiments, the effective distance Deff between the electrode 302A and the electrode 302B is defined in another way, e.g., the effective distance Deff is an average of the diameter D and the closest distance Dm between the opposite edges of the electrodes 302A and 302B. In some embodiments, a ratio between the area A and the diameter D is between about 2 and about 20, or between about 5 and about 10.

During operation, the electrode pair 302A, 302B are electrically coupled to a first sensing signal S1 and a second sensing signal S2, respectively. In some embodiments, the first sensing signal S1 is a voltage source or current source. In some embodiments, the first sensing signal S1 includes an alternating-current signal. In some embodiments, the second sensing signal S2 is coupled to ground. Therefore, the voltage spanned across the electrode pair 302A and 302B is determined by the voltage of the first sensing signal S1. In some embodiments, the first sensing signal S1 and the second sensing signal S2 are generated and provided by a signal generator according to a control signal sent by the processor 240.

In some embodiments, the capacitor structure 300 is configured to provide a sensed voltage or current in response to the first sensing signal S1 and the second sensing signal S2 and the capacitance Cs of the capacitor implemented by the capacitor structure 300. The capacitance Cs of the capacitor structure 300 may be determined according to the following formula:

$$Cs = \varepsilon \frac{A}{D_{eff}} \quad (1)$$

In the above formula, the symbol ε denotes the permittivity of the insulating layer between the electrodes 302A and 302B, e.g., the wall of the pipe section 208A. The symbol A denotes the area of the electrode 302A or 302B and the symbol Deff denotes the effective distance between the electrodes 302A and 302B.

In some embodiments, when the capacitor structure 300 does not contain any slurry 201 in the pipe section 208A, i.e., there is no slurry 201 included or flowing through the pipe section 208A, the permittivity ε is determined according to the permittivity values of the wall of the pipe section 208A and air. In such scenarios, the measurements of the capacitance value Cs are usually kept substantially constant with time. In some other embodiments, when the slurry 201 flows through the pipe section 208A, the measurements of the capacitance value Cs may vary due to the varying conditions of the slurry 201. In some embodiments, assume the capacitance associated with the pipe section 208A is denoted by Cp, and the capacitance associated with the slurry 201 is denoted by Cy. As illustrated in FIG. 3B, the capacitor structure 300 is seen from a cross-sectional view as being formed of the electrodes 302A and 302B with the insulating layer formed of the pipe section 208A and the slurry 201, where slurry 201 is in series connection with the wall of the pipe section 208A. Therefore, the capacitance value Cs can be represented by the following formula:

$$1/Cs = 1/Cp + 1/Cy. \quad (2)$$

In the above formula (2), the capacitance Cp is determined by the permittivity of the dielectric material of the wall of the pipe section 208A, while the capacitance Cy is determined by the permittivity of the compositions in the slurry 201. Moreover, the permittivity of the wall of the pipe section 208A, which may be PFA, is predetermined and constant. Based on the above, the capacitance Cy associated with the slurry 201 or the permittivity of the slurry 201 can be derived quantitatively according to the measured capacitance Cs and the calculated capacitance Cp. In some embodiments, the capacitance Cy associated with the slurry 201 can also serve as an permittivity-equivalent quality metric of the slurry 201 since they are proportional given the same settings of the area A and the effective distance Deff. In some embodiments, the capacitance Cs can also serve as a permittivity-equivalent quality metric of the slurry 201 given the same capacitance values Cp and the same settings of the area A and the effective distance Deff.

Figure 4:
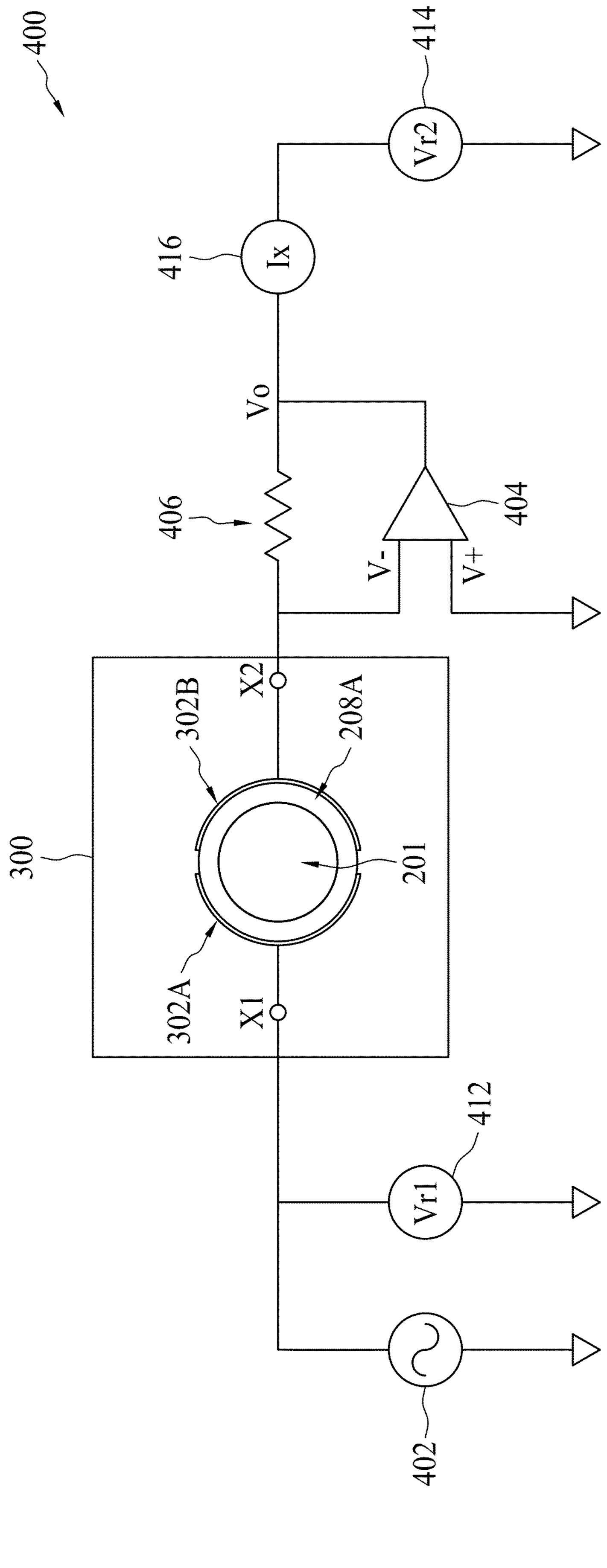
FIG. 4 is a schematic block diagram of a capacitance sensor, in accordance with some embodiments of the present disclosure.

FIG. 4 is a schematic block diagram of a capacitance sensor 400, in accordance with some embodiments of the present disclosure. The capacitance sensor 400 is configured to implement the function of capacitance sensing of the quality sensors 201 as shown in FIG. 2. In some embodiments, the capacitance sensor 400 is configured to measure the capacitance value Cs of the capacitor structure 300. In some embodiments, the capacitance sensor 400 includes a signal generator 402, an amplifier 404 and a resistive element 406 electrically coupled to the capacitor structure 300. The resistive element 406 may be connected to the amplifier 404 in parallel. The resistive element 406 may have a resistance Rx.

In some embodiments, the signal generator 402 is configured to generate the first sensing signal S1 with an alternating current waveform, e.g., a sine-wave waveform. In some embodiments, the amplifier 404 is implemented using an operational amplifier, which includes a pair of differential input terminals and an output terminal Vo, where the differential input terminals include a non-inverting input V+ and an inverting input V−. The non-inverting input V+ may be electrically coupled to ground and the inverting terminal input V− is electrically coupled to the output terminal Vo through the resistive element 406. In some embodiments, the resistive element 406 includes a resistor. In some other embodiments, the resistive element 406 is formed of a resistor and a capacitor connected in parallel to the resistor. In some embodiments, the amplifier 404 and the resistive element 406 may be included in a device for implementing the capacitor structure 300 or the processor 240.

The signal generator 402 is electrically coupled to one end of the capacitor structure 300, e.g., the electrode 302A, via a first node X1 of the capacitor structure 300, and the amplifier 404 is electrically coupled to the other end of the capacitor structure 300, e.g., the electrode 302B, via a second node X2 of the capacitor structure 300. The resistive element 406 connects the second end X2 of the capacitor structure 300 to the output terminal Vo of the amplifier 404.

In some embodiments, the capacitance sensor 400 further includes a first voltmeter 412, a second voltmeter 414 and an amperemeter 416. The first voltmeter 412 is configured to provide a voltage reading Vr1 at the first node X1, and the second voltmeter 414 is configured to provide a voltage reading Vr2 at the output terminal Vo. The amperemeter 416 is configured to measure the current level Ix flowing through the resistive element 406.

During operation, the signal generator 402 is configured to provide an alternative current signal with a frequency fc to the capacitor structure 300. The capacitor structure 300 has a property of capacitive reactance Xc in an alternating current scenario that resembles the property of a resistor in a direct current scenario. Since the non-inverting terminal V+ of the amplifier 404 is grounded, the inverting terminal V− is also regarded grounded due to the principle of virtual ground for the amplifier 404. As a result, the capacitive reactance Xc of the capacitor structure 300 can be derived by the following formula:

$$Xc = Vr1/Ix = V1 * Rx/V2 \quad (3)$$

In the above formula (3), the voltage readings Vr1 and Vr2 can be provided by the first voltmeter 412 and the second voltmeter 414, respectively, and the resistance Rx of the resistive element 406 is predetermined. Therefore, the capacitive reactance Xc can be obtained.

In some embodiments, the capacitance Cs of the capacitor structure 300 can be derived through the following formula:

$$Xc = 1/(2\pi * Cs * fc) \quad (4)$$

After the capacitance Cs of the capacitor of the capacitor structure 300 is derived according to formula (4), the permittivity ε of the slurry 201 can be derived according to formulae (1) and (2).

In some embodiments, the processor 240 shown in FIG. 2 may include hardware to implementing the formulae (1) through (4). In some embodiments, the readings of the voltmeters 412, 414 and the amperemeter 416 are transmitted to the processor 240 in a digital form. In some embodiments, the capacitance sensor 400 further includes analog-to-digital converters (ADC) configured to convert analog readings of the voltmeters 412, 414 and the amperemeter 416 into digital formats. Alternatively or additionally, the processor 240 may be configured to execute instructions for performing the calculations of the formulae (1) through (4).

Referring to FIG. 3 and FIG. 4, the capacitor structure 300 and the capacitance sensor 400 senses the capacitance value of the slurry 201 in a contact less manner. This sensing structure without contacting the slurry 201 may aid in deploying more capacitor structures 300 as the quality sensors 201 to any locations of the piping network 208 wherever suitable. In contrast, existing slurry monitoring methods may need to access to the substance of the slurry 201 to perform sensing or analysis, and therefore the alteration of the piping network 208 may be required to allow access of the slurry 201 by the existing quality sensors. As a result, it is not convenient to identify the contamination source in the piping network 208 due to the constraint of the limited deployment locations of the existing quality sensors, Therefore, the propose capacitor structure 300 is advantageous in providing more flexibility in the sensing locations of the piping network 208.

Figure 5:
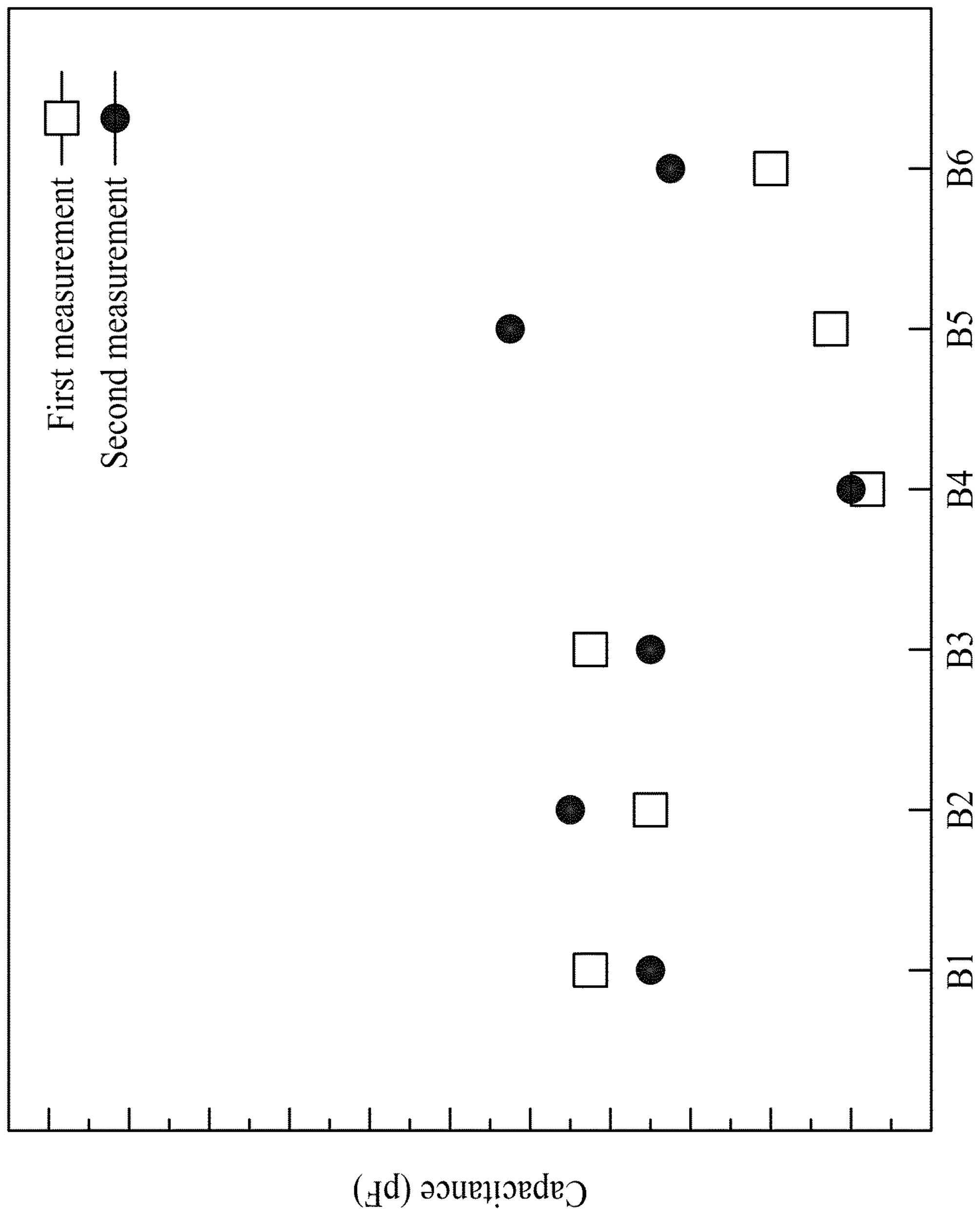
FIG. 5 is a chart showing a CMP performance result across different slurry samples, in accordance with some embodiments of the present disclosure.

FIG. 5 is a chart showing a measurement result of CMP operations for different slurry samples, in accordance with some embodiments of the present disclosure. The x-axis shows different samples B1, B2, B3 . . . B6 of the slurry 201, e.g., obtained from different batches. The y-axis represents the capacitance values Cs of the slurry 201 in different measurements of the same slurry sample.

Before the capacitance measurement operation is performed, the data of CMP performance of the respective slurry samples B1 through B6 have been collected. According to the CMP performance data, the first three samples B1, B2, and B3 provides high removal rates and small variations among different CMP operations. The fourth sample B4 provides a medium removal rate yet and a small variation among different CMP operations. The fifth sample B5 provides fluctuating performance results in terms of the removal rates. The sixth sample B6 provides fluctuating performance results in terms of the removal rates, though the extent of fluctuation is less than that of the sample B5.

From the capacitance measurement results as shown in FIG. 5, it can be seen that the capacitance values of the samples B1 through B6 exhibit a similar trend of the performance of removal rates. In some embodiments, when the quality of the slurry 201 is uniform or stable in a certain portion, the respective capacitance values Cs of the slurry 201 in this portion would also be stable or uniform with a small variation. Conversely, in some embodiments, when the quality of the slurry 201 is non-uniform or unstable in another portion, the capacitance values Cs of the slurry 201 in this another portion would also show a trend of fluctuation or a relatively large variation, the extent of which depending upon the condition of this slurry portion. Moreover, in some embodiments, a high removal rate of the slurry 201 corresponds to a high capacitance value of the slurry 201, and a low removal rate of the slurry 201 corresponds to a low capacitance value of the slurry 201. Based on the above, the capacitance of the slurry 201 is shown to be sufficiently sensitive to the quality variation of the slurry 201 in terms of the removal rate, and thus is suitable to serve as a composite quality metric of the slurry 201 in real time during feeding the slurry 201.

Figure 6A:
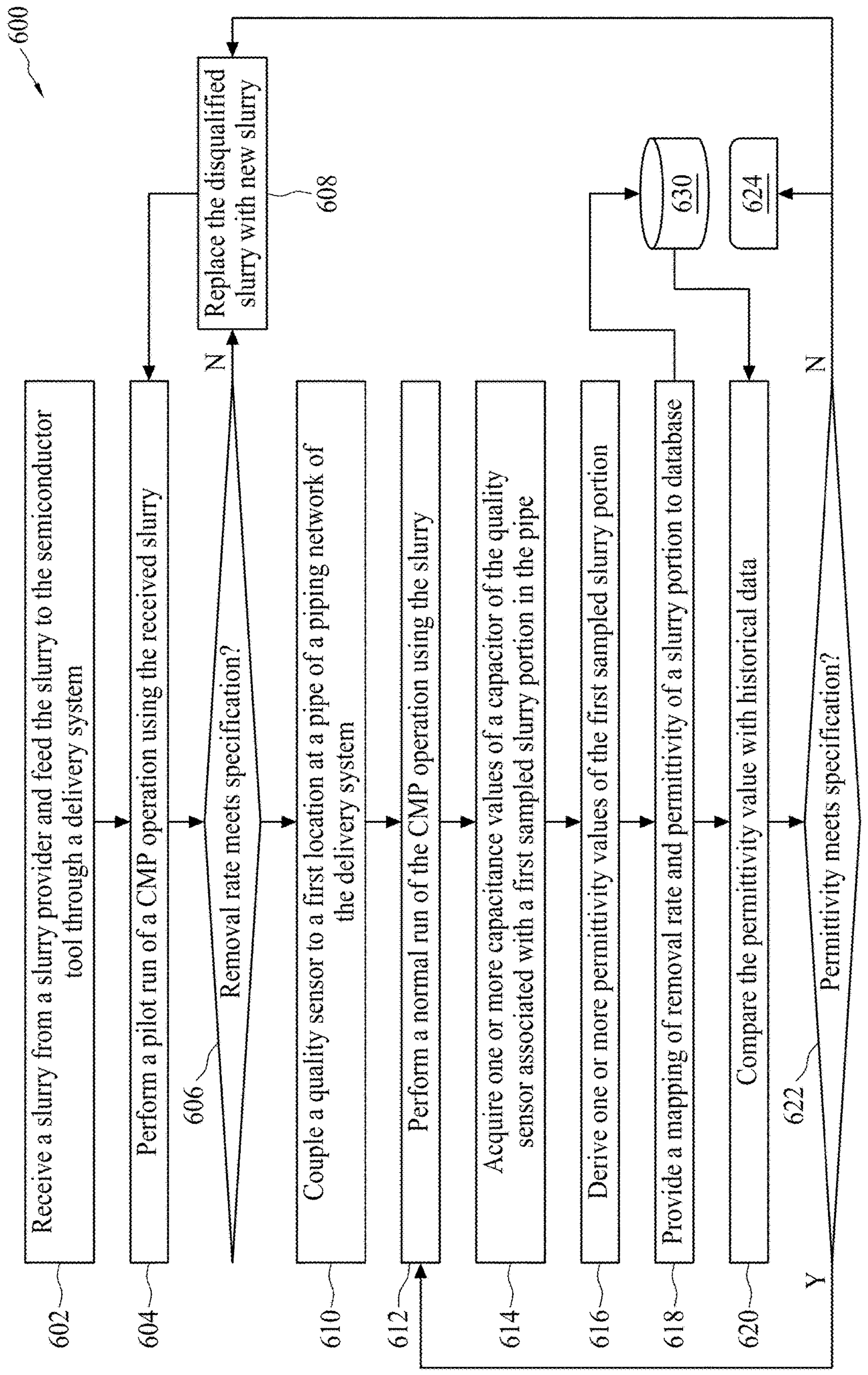
FIGS. 6A and 6B show a flowchart of a method of manufacturing a semiconductor structure, in accordance with some embodiments.
Figure 6B:
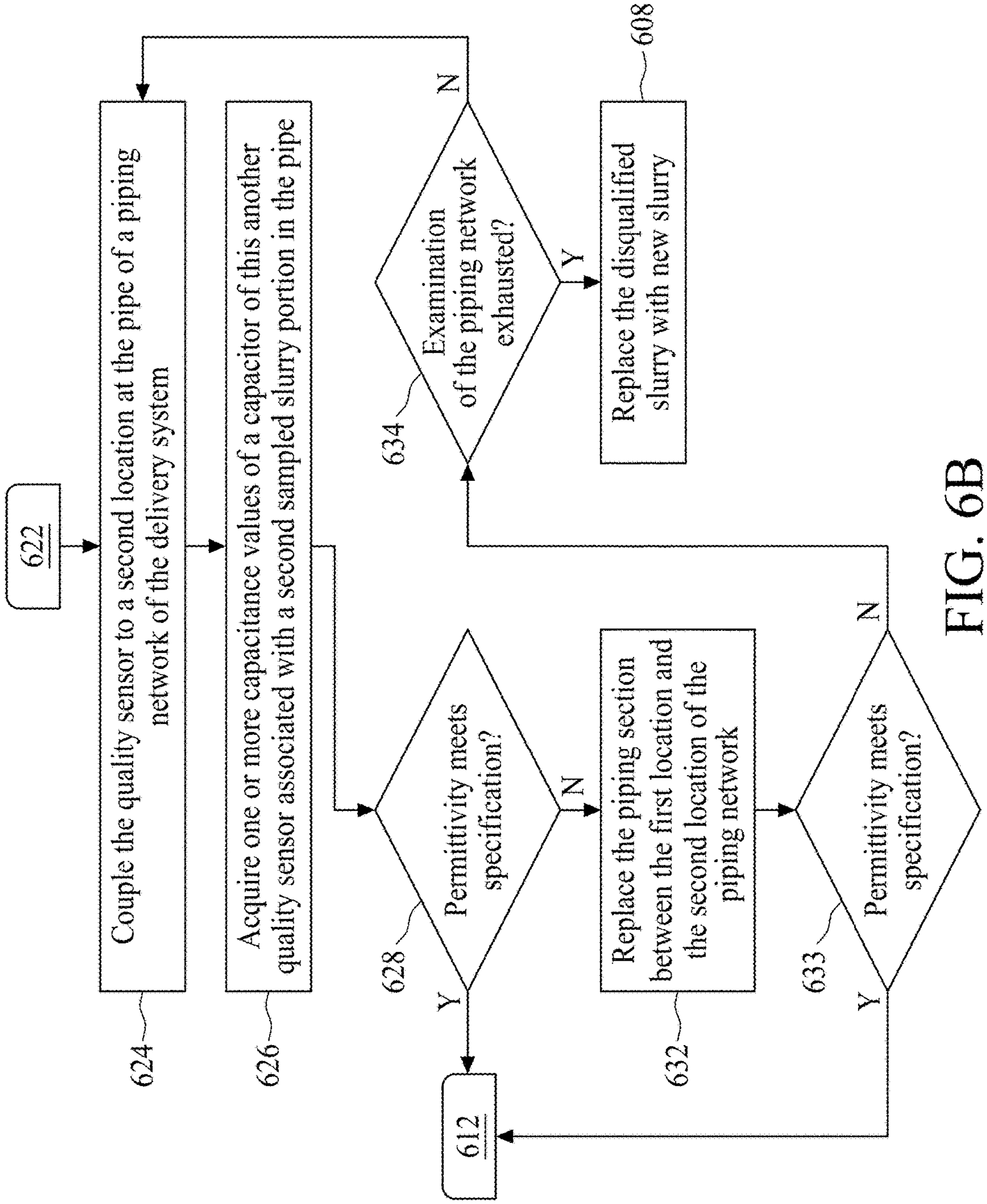

FIGS. 6A and 6B show a flowchart of a method 600 of manufacturing a semiconductor structure, in accordance with some embodiments. The method 600 may be performed by the slurry delivery system 200, the capacitor structure 300, and the capacitance sensor 400 as shown in FIG. 2, FIG. 3 and FIG. 4, respectively. It is understood that additional steps can be provided before, during, and after the steps shown by FIGS. 6A and 6B, and some of the steps described below can be replaced or eliminated, for additional embodiments of the method 600. The order of the steps may be interchangeable.

Referring to FIG. 6A, at step 602, a slurry is received from a slurry provider. The slurry is fed to the semiconductor tool through a delivery system. In some embodiments, the slurry received at step 602 is raw slurry. In some embodiments, the raw slurry is processed into a diluted and/or blended slurry before being applied in a CMP operation. At step 604, a pilot run of a CMP operation is performed using the received slurry.

At step 606, it is determined whether the removal rate of CMP operation using the slurry meets specification. In some embodiments, the determination includes examining an average removal rate and a removal rate variation associated with the slurry. The slurry specification in terms of the removal rate may be represented as reference data of the average removal rate and the removal rate variation, which may be obtained from historical data stored in a database 630.

In some embodiments, the determination of the slurry quality performed for the pilot run at step 606 includes a binary pass/fail test. In some embodiments, the determination of the slurry quality performed for the pilot run at step 606 does not include a quantitative examination of the slurry.

In some embodiments, the specification for the binary pass/fail test includes at least one of a predetermined highest removal rate, a predetermined lowest removal rate, and a predetermined removal rate variation threshold with respect to a target slurry. In some embodiments, a target slurry is regarded as meeting the specification if the removal rate(s) associated with the target slurry is between the highest removal rate and the lowest removal rate. In some embodiments, a target slurry is regarded as meeting the specification if the variation of the removal rates associated with the target slurry is lower than the removal rate variation threshold. The predetermined highest removal rates, the predetermined lowest removal rates and the predetermined removal rate variation thresholds may be different for different types of slurries.

If it is determined that the removal rate associated with the slurry does not meet the specification, the disqualified slurry is replaced with new slurry at step 608. The method 600 will return to step 606 where the replaced slurry is subject to another pilot run and another run of quality examination until the examined slurry meets the specification.

If it is determined that the slurry passes the examination performed at step 606, the method proceeds with step 610, where a quality sensor is coupled to a first location at a pipe of a piping network of the delivery system for performing on-line, universal and quantitative monitoring of the slurry quality. The quality sensor is configured to detect a capacitance value of the slurry. In some embodiments, the quality monitoring of the slurry may include using more quality sensors to perform detection of at least one of a pH value, a liquid particle size, a concentration of hydrogen peroxide, a density, a conductivity, an ion concentration, or the like, of the slurry 201.

At step 612, one or more normal runs of the CMP operation are performed using the qualified slurry.

At step 614, one or more capacitance values of a capacitor in the quality sensor associated with a first sampled slurry portion in the pipe is acquired. In some embodiments, one or more of the valves of the slurry delivery system is switched off during the period of quality monitoring, e.g., capacitance sensing, for isolating a portion of the slurry and performing the capacitance sensing on an immobile slurry portion for improve sensing accuracy. In some embodiments, one or more first sampled slurry portion are provided in one sensing operation, e.g., by controlling the switching of the valves multiple times when the slurry continues to flow in the piping network, to generate multiple capacitance values of the capacitor in the quality sensor.

In some embodiments, the order of steps 612 and 614 can be interchanged or they can be performed at the same time. In some embodiments, multiple quality sensors can be deployed at the same time in different locations of the piping network and coupled to different pipes of the piping network. In this scenario, the one or more capacitance values are acquired in different locations of the piping network by different quality sensors, e.g., the quality sensors 210A through 210D as illustrated in FIG. 2.

At step 616, one or more permittivity value(s) of the first sampled slurry portion is derived based on the corresponding capacitance values. In some embodiments, the one or more capacitance value(s) of the first sampled slurry portion are transmitted to a receiver or a processor for deriving the permittivity values. In some embodiments, an average permittivity value or a permittivity variation based on the multiple permittivity values are also derived.

At step 618, mapping data between the removal rate(s) and the permittivity of a slurry portion is collected and provided to the database 630. The mapping data may include at least one of a removal rate of one CMP operation, an average removal rate, and a removal rate variation.

At step 620, the permittivity value, the derived average permittivity value or the permittivity variation is compared with historical data of permittivity values to examine whether the permittivity value meets the specification. In some embodiments, the historical data of permittivity values are accessible from the database 630.

In some embodiments, the specification for the permittivity value includes at least one of a predetermined highest permittivity value, a predetermined lowest permittivity value, and a predetermined permittivity variation threshold with respect to a target slurry. In some embodiments, a target slurry is regarded as meeting the specification if the permittivity associated with the target slurry is between the predetermined highest permittivity value and the predetermined lowest permittivity value. In some embodiments, a target slurry is regarded as meeting the specification if the variation of the permittivity values associated with the target slurry is lower than the permittivity variation threshold. The predetermined highest permittivity values, the predetermined lowest permittivity values and the predetermined permittivity variation thresholds may be different for different types of slurries.

As discussed previously, the permittivity value of the slurry can be determined based on the measured capacitance Cy of the slurry according to the measured capacitance Cs and the calculated capacitance Cp. As a result, the specification of the permittivity of the slurry can be determined according to the measured capacitance Cs obtained through the quality sensors 210 and parameters of the quality sensors 210, such as the effective distance Deff and the electrode area A of the capacitor structure 300.

In some embodiments, the specification for the permittivity value includes at least one of a predetermined highest capacitance value, a predetermined lowest capacitance value, and a predetermined capacitance variation threshold, all obtained through a capacitor structure for monitoring a target slurry. In some embodiments, a target slurry is regarded as meeting the specification if the measured capacitance value associated with the target slurry is between the predetermined highest capacitance value and the predetermined lowest capacitance value. In some embodiments, a target slurry is regarded as meeting the specification if the variation of the capacitance values associated with the target slurry is lower than the capacitance variation threshold. The predetermined highest capacitance values, the predetermined lowest capacitance values and the predetermined capacitance variation thresholds may be different for different types of slurries.

In some embodiments, the predetermined highest capacitance value is in a range between about 200 pico farad (pF) and about 5000 pF. In some embodiments, the predetermined lowest capacitance value is in a range between about 50 pF and about 4000 pF. In some embodiments, the predetermined capacitance variation threshold is in a range between about 20 pF and about 1000 pF.

At step 622, it is determined whether the permittivity of the first sampled slurry portion meets the specification. In some embodiments, the determination further includes examining the average removal rate and the removal rate variation associated with the first sampled slurry portion. The reference data of the average removal rate and the removal rate variation may be obtained from the database 630.

In some embodiments, the determination of the slurry quality performed for the pilot run at step 622 includes an incremental test. In some embodiments, the determination of the slurry quality performed for the pilot run at step 606 takes into consideration the quantitative result of the examination of the slurry. For example, in some embodiments, if the permittivity value or the capacitance value of the first sampled slurry portion is close to a boundary of a pass/fail test, another capacitance sensing of the same sampled slurry portion or another sampled slurry portion of the same batch is subject to examination to improve the detection accuracy.

If it is determined that the slurry passes the examination performed at step 622, the method 600 returns to step 612 to one or more normal runs of the CMP operation is performed using the qualified slurry, and one or more on-line capacitance value sensing operations are performed to continue monitor the slurry quality with reference to steps 614 and 616. In the meantime, a mapping table for the removal rate and the permittivity properties, such as average permittivity and permittivity variation, of other sampled slurry portions continue to be provided to the database 630 with reference to step 618. The mapping table may include at least one of a removal rate of a CMP operation, an average removal rate, and a removal rate variation.

If it is determined that the permittivity of the sampled slurry portion does not meet the specification, the disqualified slurry is replaced with new slurry at step 608. The method 600 will return to step 606 where the replaced slurry is subject to another pilot run and quality examination until the examined slurry meets the specification.

Referring to FIG. 6B, in some embodiments, instead of proceeding with step 608, the method 600 alternatively proceeds with at step 624, where the quality sensor is coupled to a second location at the pipe of a piping network of the delivery system. Alternatively or additionally, in additional to the original quality sensor coupled to the first location of the pipe, another quality sensor is coupled to the second location of the pipe or another pipe of the piping network, Referring to FIG. 2, the first location may be where the quality sensor 210C resides and the second location may be at the quality sensor 210A or 210B, or a location between the valve V6 and the filter F2.

As discussed previously, the proposed capacitance sensing method is performed without contacting the slurry under monitoring. Therefore, it is not required to alter the physical structure of the piping network for deploying an additional quality sensor. The sensing flexibility can be improved accordingly.

At step 626, one or more capacitance values of a capacitor of this another quality sensor associated with a second sampled slurry portion, associated with the second location, of the pipe is acquired. The acquiring of the capacitance value at the second location is performed in a similar manner to that for acquiring the capacitance value at the first location.

At step 628, it is determined whether the permittivity of the second sampled slurry portion meets the specification. In some embodiments, the determination further includes examining the average removal rate and the removal rate variation associated with the second sampled slurry portion. The reference data of the average removal rate and the removal rate variation may be obtained from the database 630.

If it is determined that the permittivity of the second sample slurry does not meet the specification, that means the piping section between the first location and the second location may include contamination sources to cause the slurry to degrade or deteriorate. The method 600 then proceeds with step 632 to replace the piping section between the first location and the second location. The method then returns to step 612 to perform a normal run of the CMP operation. If it is determined that the permittivity of the second sample slurry meets the specification, then the method 600 returns to step 612 to perform a normal run of the CMP operation.

If it is determined at step 633 that the permittivity of the second sample slurry still does not meet the specification, it is determined at step 634 whether examination of all of the piping network of the delivery system is exhausted. If affirmative, that means the deterioration of the slurry is not relevant to the condition of the piping network of the delivery system. The method 600 then proceeds to step 608 to replace the disqualified slurry with new slurry.

Figure 7:
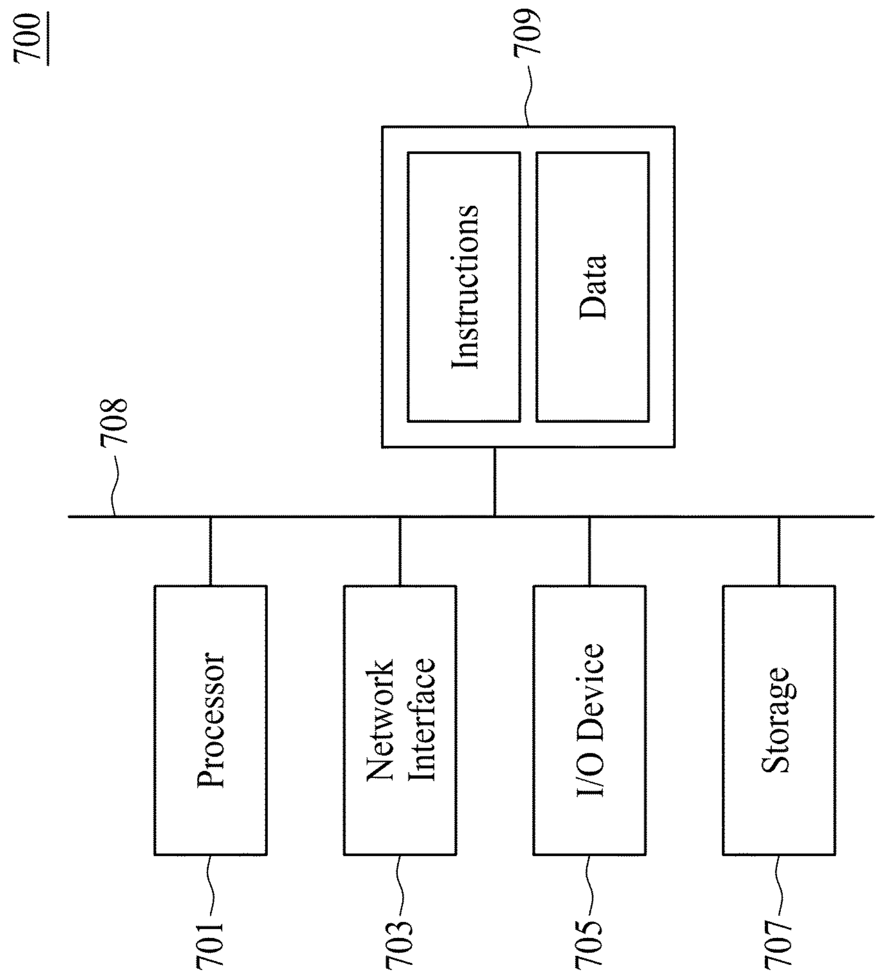
FIG. 7 is a schematic diagram of a system implementing a slurry quality monitoring method, in accordance with some embodiments.

FIG. 7 is a schematic diagram of a system 700 for implementing a slurry quality monitoring method, in accordance with some embodiments. The system 700 includes a processor 701, a network interface 703, an input and output (I/O) device 705, a storage 707, a memory 709, and a bus 708. The bus 708 couples the network interface 703, the I/O device 705, the storage 707, the memory 709 and the processor 701 to each other.

The processor 701 may include the processor 240. The processor 701 is configured to execute program instructions configured to perform capacitance sensing as described and illustrated with reference to figures of the present disclosure. In some embodiments, the processor 701 is configured to access historical data from a database and perform comparison between the capacitance (or permittivity) and the historical data of removal rates. In some embodiments, the processor 701 is configured to generate the mapping data between the capacitance (or permittivity) and the removal rates.

The network interface 703 is configured to access program instructions and data accessed by the program instructions stored remotely through a network (not shown). In some embodiments, the network interface 703 connects the processor 701 to the piping network 208 for controlling switching of the valves V1 through V12, the pumps P1, P2, and the filter F1, F2 or F3. In some embodiments, the network interface 703 connects the processor 701 to the semiconductor tool 232, 234 or 236 to control operations of thereof, e.g., a CMP operation.

The I/O device 705 includes an input device and an output device configured for enabling user interaction with the system 700. In some embodiments, the input device comprises, for example, a keyboard, a mouse, and other devices. Moreover, the output device comprises, for example, a display, a printer, and other devices.

The storage device 707 is configured for storing program instructions and data accessed by the program instructions. In some embodiments, the storage device 707 comprises a non-transitory computer readable storage medium, for example, a magnetic disk and an optical disk. In some embodiments, the storage device 707 includes one or more databases, e.g., the database 630, for storing the mapping data or mapping table of the CMP operation.

The memory 709 is configured to store program instructions to be executed by the processor 701 and data accessed by the program instructions. The memory 709 may also include a database, such as the database 630, configured to store historical data of a mapping table between the capacitance values, or permittivity values, and the CMP removal rate performance, such as an average removal rate and a removal rate variation. In some embodiments, the memory 709 comprises any combination of a random-access memory (RAM), some other volatile storage device, a read only memory (ROM), and some other non-volatile storage device.

Some embodiments of the present disclosure provide a method. The method includes: delivering a slurry to a semiconductor tool through a piping network of a slurry delivery system; coupling an electrode pair to an outer wall of a pipe of the piping network; measuring one or more capacitance values associated with the electrode pair with the slurry being an insulating layer between the electrode pair; deriving a quality metric of the slurry according to the one or more capacitance values and performing a chemical mechanical polishing operation using the semiconductor tool in response to the quality metric of the slurry as meeting a specification.

Some embodiments of the present disclosure provide a method. The method includes receiving a slurry from a portable container; delivering the slurry from the portable container to a semiconductor tool through a tank and a first pipe; coupling a first capacitance sensor to the first pipe; measuring a first capacitance value of the first capacitance sensor while providing the slurry to the tank through the first pipe; deriving a quality metric of the slurry according to measurements of the first capacitance value; and determining whether a chemical mechanical polishing operation using the semiconductor tool is performed according to the quality metric of the slurry for the first pipe.

Some embodiments of the present disclosure provide a system. The system includes a tank configured to store a slurry; a piping network connected between a portable container and the tank and between the tank and a semiconductor tool; one or more capacitance sensors coupled to a pipe of the piping network and configured to measure one or more capacitance values of the capacitance sensor associated with the slurry in the pipe; and a processor. The processor is configured to derive a quality metric of the slurry according to the one or more capacitance values, and cause the semiconductor tool to perform a chemical mechanical polishing operation using the semiconductor tool in response to the quality metric of the slurry as meeting a specification.

The foregoing outlines features of several embodiments so that those skilled in the art may better understand the aspects of the present disclosure. Those skilled in the art should appreciate that they may readily use the present disclosure as a basis for designing or modifying other operations and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
- delivering a slurry to a semiconductor tool through a piping network of a slurry delivery system;
- coupling an electrode pair to an outer wall of a pipe of the piping network;
- electrically coupling a signal generator and a first voltmeter to a first node of the electrode pair;
- electrically coupling a second voltmeter to a second node of the electrode pair through a resistor and an amperemeter;
- measuring one or more capacitance values associated with the electrode pair according to a first voltage level provided to the first node and a current level provided at the second node with the slurry being an insulating layer between the electrode pair;
- deriving a quality metric, comprising a slurry permittivity, of the slurry according to the one or more capacitance values;
- determining a removal rate of the slurry through a mapping between the slurry permittivity and the removal rate of the slurry; and
- performing a chemical mechanical polishing operation using the semiconductor tool in response to the slurry permittivity meeting a specification.

2. The method of claim 1, wherein the electrode pair comprises a first electrode and a second electrode each having a curved shape conformal to the outer wall of the pipe.

3. The method of claim 1, wherein the signal generator and the first voltmeter are connected in parallel.

4. The method of claim 1, wherein the deriving of the quality metric comprises determining a variation of the slurry permittivity.

5. The method of claim 1, further comprising controlling switching of valves of the piping network to immobilize a portion of the slurry during the measuring of the one or more capacitance values.

6. The method of claim 1, wherein the slurry delivering system comprises a tank configured to store the slurry and a pump configured to pump the slurry from the tank to the semiconductor tool, wherein the pipe is arranged between the tank and the pump.

7. The method of claim 1, wherein the resistor and the amperemeter are connected in series.

8. The method of claim 1, wherein a current associated with the current level comprises an alternating-current waveform.

9. The method of claim 1, further comprising electrically connecting an amplifier to the resistor in parallel.

10. The method of claim 1, wherein the mapping is provided through accessing a mapping table of historical data between the slurry permittivity and removal rate performances of the chemical mechanical polishing operation.

11. A method, comprising:
- delivering a slurry from a portable container to a semiconductor tool through a tank and a first pipe;
- coupling a first capacitance sensor to the first pipe;
- electrically coupling a signal generator and a first voltmeter to a first node of the first capacitance sensor;
- electrically coupling a second voltmeter to a second node of the first capacitance sensor through a resistor and an amperemeter;
- measuring a first capacitance value of the first capacitance sensor according to a first voltage level provided to the first node and a current level provided at the second node while the slurry is within the first pipe;
- deriving a quality metric associated with a slurry permittivity of the slurry according to measurements of the first capacitance value;
- determining a removal rate of the slurry through a mapping between the slurry permittivity and the removal rate of the slurry; and
- performing a chemical mechanical polishing operation using the semiconductor tool in response to the slurry permittivity meeting a specification.

12. The method of claim 11, wherein the deriving of the quality metric comprises determining a permittivity value of the slurry according to the first capacitance value of the first pipe.

13. The method of claim 11, wherein the deriving of the quality metric comprises determining an average permittivity of the slurry.

14. The method of claim 11, wherein the quality metric further comprises a variation of the slurry permittivity.

15. The method of claim 14, further comprising:
- delivering the slurry from the tank to the semiconductor tool through a second pipe;
- coupling a second capacitance sensor to the second pipe;
- measuring a second capacitance value of the second capacitance sensor while the slurry is within the second pipe, wherein the deriving of the quality metric of the slurry further takes the second capacitance value into account; and
- performing the chemical mechanical polishing operation using the semiconductor tool in response to the quality metric of the slurry around the first pipe and the second pipe meeting the specification.

16. The method of claim 11, wherein the first capacitance sensor comprises an electrode pair wrapping around an outer wall of the first pipe, further comprising connecting the first capacitance sensor to an amplifier and the resistor.

17. A method, comprising:
- delivering a slurry from a portable container to a semiconductor tool through a first pipe and a tank, wherein the first pipe connects the tank and the semiconductor tool;

coupling a first capacitance sensor to the first pipe;

electrically coupling a signal generator and a first voltmeter to a first node of the first capacitance sensor;

electrically coupling a second voltmeter to a second node of the first capacitance sensor through a resistor and an amperemeter;

measuring a first capacitance value of the first capacitance sensor according to a first voltage level provided to the first node while the slurry stays within the first pipe;

deriving a quality metric, comprising a slurry permittivity, of the slurry according to measurements of the first capacitance value;

determining a removal rate of the slurry through a mapping between the slurry permittivity and the removal rate of the slurry; and performing a chemical mechanical polishing operation using the semiconductor tool in response to the slurry permittivity meeting a specification.

18. The method of claim 17, further comprising causing a first portion of the slurry to stop while the slurry stays within the first pipe; and performing the measuring of the first capacitance value of the slurry around the first portion.

19. The method of claim 18, further comprising switching off valves arranged on two sides of the first portion to cause the first portion of the slurry to stop.

20. The method of claim 17, further comprising:

determining whether examination of all of a piping network of a slurry system is exhausted in response to the slurry permittivity failing to meet the specification, wherein the piping network comprises the first pipe.

* * * * *